United States Patent
Staley

[11] Patent Number: 6,004,401
[45] Date of Patent: Dec. 21, 1999

[54] METHOD FOR CLEANING A SEMICONDUCTOR STRUCTURE

[75] Inventor: Dennis Staley, Boise, Id.

[73] Assignee: Micron Technology Inc, Boise, Id.

[21] Appl. No.: 09/032,701

[22] Filed: Mar. 2, 1998

[51] Int. Cl.$^6$ .............................. B08B 3/04; B08B 3/08; C23G 1/02

[52] U.S. Cl. .................... 134/2; 134/3; 134/10; 134/25.4; 134/26; 134/28; 134/34; 134/182; 134/186; 134/902

[58] Field of Search .............................. 134/2, 3, 26, 10, 134/25.4, 28, 182, 186, 902

[56] References Cited

U.S. PATENT DOCUMENTS

| | | | |
|---|---|---|---|
| 5,816,274 | 10/1998 | Bartram et al. | 134/902 X |
| 5,845,663 | 12/1998 | Han | 134/902 X |
| 5,873,381 | 2/1999 | Han | 134/182 |

Primary Examiner—Zeinab El-Arini
Attorney, Agent, or Firm—Workman, Nydegger & Seely

[57] ABSTRACT

A shielding apparatus and method of use for preventing premature entry of a liquid into an overflow drain tube. The shielding apparatus has a shielding member, which may be convex, positioned over an opening of the overflow drain tube. The shielding member deflects airborne liquid and prevents the airborne liquid from passing through the opening. The shielding apparatus also has at least one stem that is inserted through the opening and into the bore of the overflow drain tube. At least one spacer provides a space between at least a portion of the shielding member and a rim that surrounds the opening. The shielding apparatus may be used in a system for cleaning semiconductor structures by preventing liquid from being splashed or projected into the opening of the overflow drain tube. Methods for shielding an overflow drain tube and for cleaning semiconductor structures are also disclosed.

18 Claims, 5 Drawing Sheets

METHOD FOR CLEANING A SEMICONDUCTOR STRUCTURE

BACKGROUND OF THE INVENTION

1. The Field of the Invention

The present invention relates to systems and methods for regulating the flow of a liquid through tanks or reservoirs. More particularly, the present invention relates to a shielding apparatus for preventing the premature flow of a liquid through an overflow drain tube. The shielding apparatus may be used in systems for cleaning semiconductor structures in an acid bath.

2. The Relevant Technology

Integrated circuits and other semiconductor structures are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term "semiconductor structure" shall refer to any construction that includes semiconductive material or that is formed over a semiconductor substrate. The term semiconductor substrate is contemplated to include such structures as silicon-on-insulator and silicon-on-sapphire.

During the process of manufacturing integrated circuits and other semiconductor structures, contaminants, such as particulates and residue, accumulate on surfaces thereof. These contaminants generally must be cleaned from surfaces of semiconductor structures in order to ensure reliable operation of the finished product and to allow formation of further layers and structures on the surfaces. A common method of cleaning semiconductor structures involves an acid bath in which the semiconductor structures are placed in a tank or reservoir containing an acidic solution.

A conventional system for cleaning semiconductor structures is seen in FIG. 1. Cleaning system 10 includes an inner first reservoir 12 and an outer second reservoir 14. A plurality of semiconductor wafers 16 are placed within first reservoir 12, and are commonly secured in position using a boat or another carrier. Cleaning system 10 is operated by circulating a liquid through the reservoirs 12 and 14 using pump 18. The liquid may be, for example, an acidic solution including sulfuric acid.

A first volume 20 of the liquid is contained in first reservoir 12 and a second volume 22 of the liquid is contained in second reservoir 14. Pump 18 causes the liquid to flow through an inlet channel 24 and through an inlet orifice 26 into first reservoir 12. The acidic solution flows over the surfaces of semiconductor wafers 16 in first reservoir 12, thereby dissolving, chemically degrading, or otherwise washing away contaminants and impurities. The liquid leaves first reservoir 12 by flowing or cascading over inner wall 28 and into second reservoir 14. The liquid is held in second reservoir 14 until it is pumped into outlet orifice 30 and through outlet channel 32 into pump 18. During operation of cleaning system 10, the flow of liquid through pump 18 and the elevations of first volume 20 and second volume 22 remain substantially constant.

Occasionally, outlet channel 32 is blocked, or the normal flow of liquid through cleaning system 10 is otherwise disrupted. In order to deal with such situations, a safety mechanism, including overflow drain tube 34, is included in cleaning system 10 to prevent the acidic solution from overflowing into the surrounding environment. This is particularly important because spillage of the acidic solution would be hazardous to nearby technicians, other workers, and laboratory and industrial property.

As seen in FIG. 2, overflow drain tube 34 typically extends through second volume 22 and has a substantially vertical axis through a section 35 that terminates at rim 36 surrounding opening 38. Opening 38 is positioned at a predetermined elevation over the normal operating elevation of second volume 22. Under ordinary conditions, second volume 22 has an equilibrium elevation that is several inches lower than the elevation of first volume 20. When cleaning system 10 malfunctions and second volume 22 rises to an elevation equal to or slightly higher than the predetermined elevation, some of the liquid pours over rim 36 and is removed from cleaning system 10 through overflow drain tube 34.

While the foregoing system for draining excess liquid and preventing overflow is generally adequate for preventing acid from spilling into the surroundings, a problem has been observed during operation of the system. This problem arises when a portion of the liquid to becomes airborne in cleaning system 10. For example, as liquid moves from first volume 20 to second volume 22, some of the liquid is splashed or otherwise projected into the air above second volume 22 at some point during operation of cleaning system 10. Alternatively, when the liquid in cleaning system 10 is heated, the liquid can be head to a rolling boil which may cause the liquid to splash or otherwise be projected into the air above second volume 22. Airborne liquid 40, from either of the two foregoing scenarios, can fall through opening 38 and be prematurely drained from the cleaning system 10 through overflow drain tube 34.

It has been found that during extended operation of cleaning system 10, enough of the liquid becomes airborne and passes through opening 38 to significantly lower the elevation of second volume 22. Eventually, second volume 22 may be left with little or no liquid such that pump 18 begins to draw air through outlet channel 32. In such situations, the entire system is disrupted, often to the extent that semiconductor wafers 16 are dislodged from their position within first reservoir 12. Accordingly, semiconductor wafers 16 may be damaged or, in any event, the system must be shut down for a period of time which leads to inefficiency and increases the cost of the manufacturing process.

FIG. 3 illustrates a cantilevered shielding apparatus 42 that has been developed in response to the foregoing problem of premature drainage of liquid through overflow drain tube 34. Cantilevered shielding apparatus 42 covers opening 38 to prevent airborne liquid 40 from passing therethrough. Cantilevered shielding apparatus 42 is supported by inner wall 28 and is secured thereto by means of a screw 44 or other tightening device. However, cantilevered shielding apparatus 42 has often proved unsatisfactory because it is easily dislodged from inner wall 28. When cantilevered shielding apparatus 42 is displaced or falls out of position, it loses its effectiveness, and airborne liquid 40 begins to be projected into opening 38 once again. In such circumstances, cleaning system 10 is easily disrupted as if no shielding apparatus were present, and semiconductor wafers 16 are again at risk of being damaged.

In view of the foregoing, it would be an advancement in the art to provide a shielding apparatus that prevents entry of airborne liquid into an overflow drain tube while reliably remaining in position relative to the drain tube. It would also be an advancement in the art to provide systems and methods for cleaning semiconductor structures using such a reliable shielding apparatus.

SUMMARY OF THE INVENTION

The present invention is directed to an apparatus for shielding an opening of a tube and for preventing airborne liquid from falling into the opening. According to the invention, a tube has a rim at one end thereof. The rim defines both a plane and an opening to the tube. A shielding member is provided over the opening of the tube and has a width greater than that of the opening. A structure, which can be one or more spacers, is in contact with the shielding member. The structure is also is in contact with the rim. The interface between the structure and the rim is substantially co-planar with the plane defined by the rim. The structure provides a gap that is in fluid communication with the opening.

The shielding member is a part of a shielding apparatus and has a generally convex top surface configured to deflect any airborne liquid that comes in contact therewith. At least one stem extends from the shielding member such that the stem may be inserted into the bore of the tube. The stem serves to align the shielding member with the opening of the tube and to secure the shielding apparatus in place.

Alternatively stated, the shielding apparatus has one or more structures, such as spacers, that are configured to be in contact with the rim of the tube. The spacers provide a space between at least a portion of the shielding member and the rim. This space allows liquid to flow over the rim and into the opening if a volume of liquid reaches a predetermined elevation. In this manner, the tube can function as an overflow drain tube while the shielding apparatus is in position.

The shielding apparatus of the invention is not merely fastened to a wall of a tank or reservoir with which it is used, but is instead in contact with the tube that is to be shielded. The shielding apparatus as disclosed herein is not subject to being dislodged or displaced during operation of a cleaning system in which it is used. As a result, a cleaning system using the shielding apparatus may be reliably operated for an extended period without the risk of the liquid of the system being prematurely drained through the overflow drain tube.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The present invention is directed to a shielding apparatus for preventing liquid from prematurely passing into an opening of a tube. The shielding apparatus is configured to be placed in contact with the tube that is to be shielded. The shielding apparatus includes a shielding member which is disposed over the opening of the tube in order to deflect airborne liquid away from the opening. As used herein, the term "airborne liquid" shall refer to a liquid or a portion of a liquid that is cast, projected, or splashed into the air; that is cascading or falling from a higher level to a lower level; or that is in a state of free fall. The shielding member may be convex or may have another suitable shape that directs liquid away from the opening. At least one stem extends from the shielding member and is inserted into a bore of the tube in order to align the shielding member with the opening and to prevent the shielding apparatus from being displaced. A spacer provides a space between a rim that surrounds the opening of the tube and at least a portion of the shielding member. Accordingly, the opening remains unobstructed and can drain excess liquid from a tank or reservoir while the shielding apparatus is in position.

Figure 1:
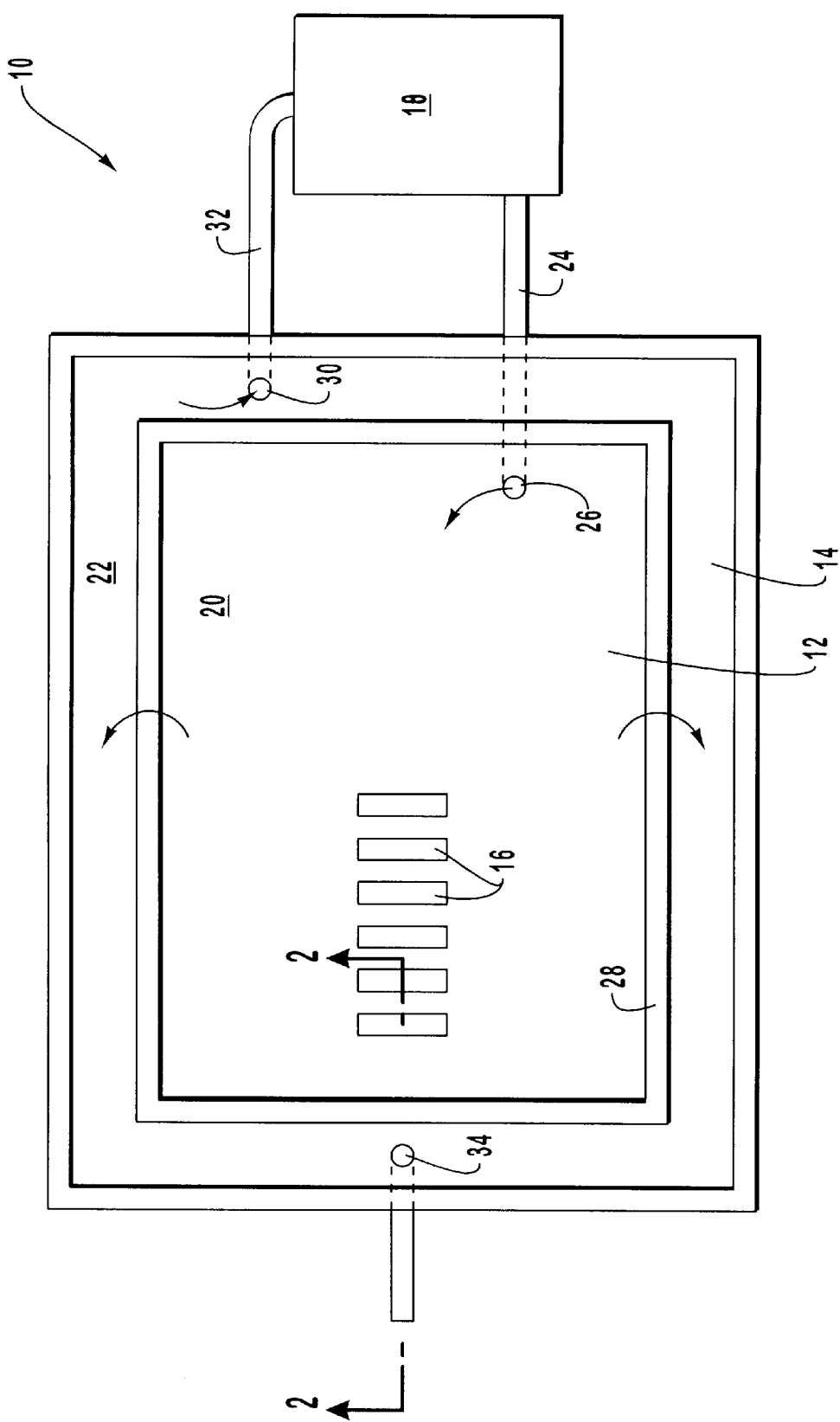
FIG. 1 is a top view of a prior art system for circulating a cleaning solution through a series of reservoirs and over a plurality of semiconductor structures.
Figure 2:
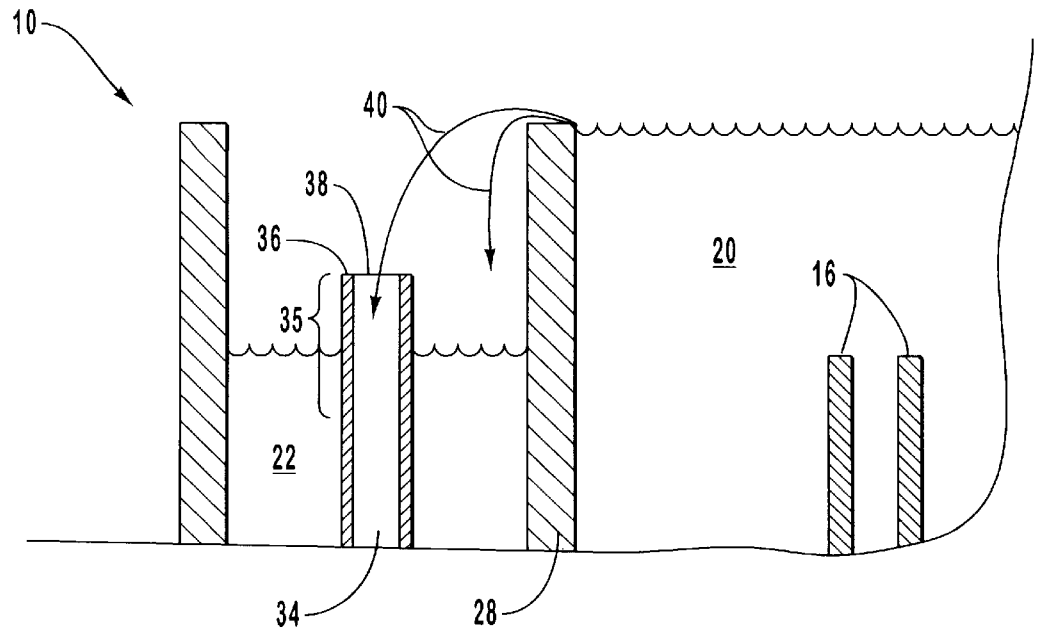
FIG. 2 is a partial cross sectional elevation view of the system of FIG. 1 taken along section line 2—2, illustrating an overflow drain tube positioned within an outer reservoir to receive excess liquid.
Figure 3:
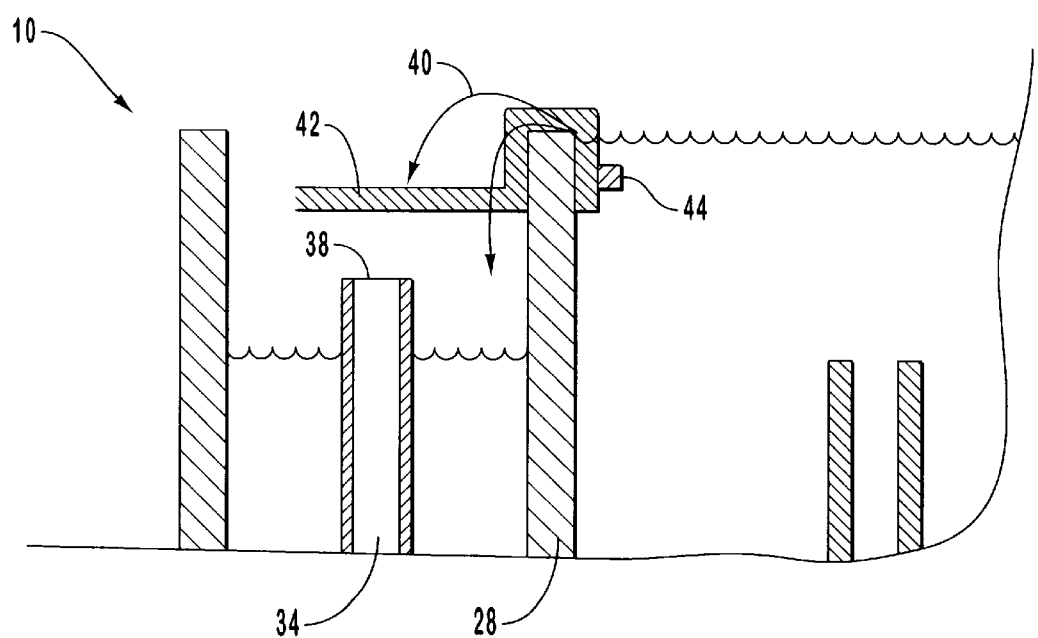
FIG. 3 is a partial cross sectional elevation view of the system of FIG. 1 taken along section line 2—2, and adding thereto an depiction of a cantilevered shielding apparatus as practiced in the prior art.
Figure 4:
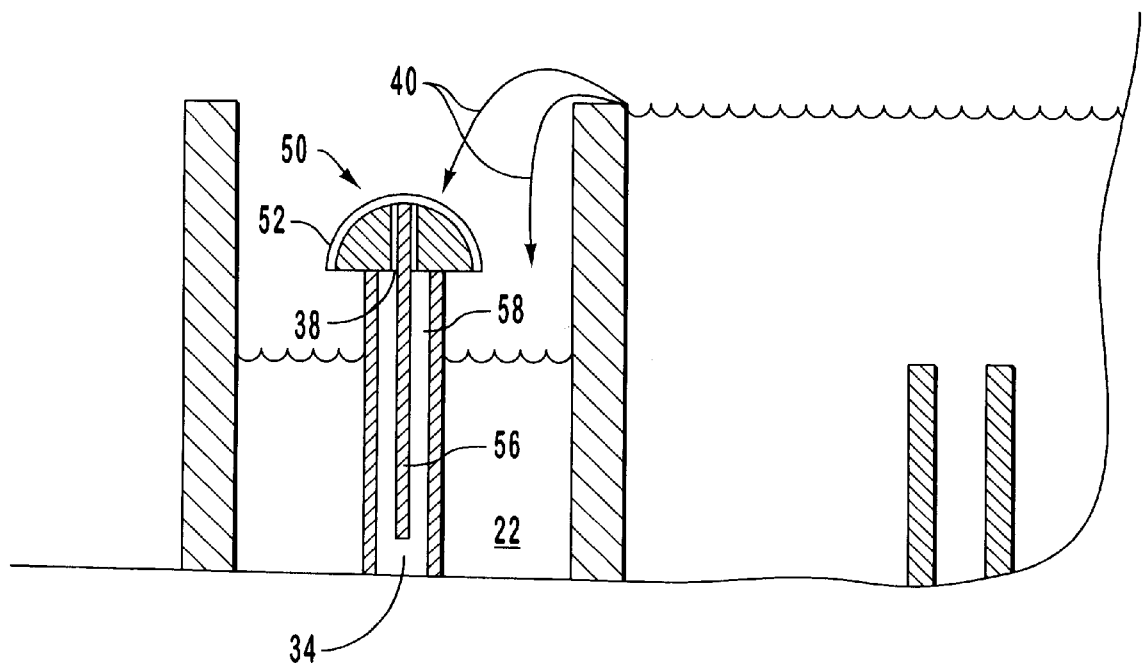
FIG. 4 is a partial cross sectional elevation view of the system of FIG. 1 taken along section line 2—2, and adding thereto an depiction of a shielding apparatus of the present invention. The shielding apparatus is positioned in contact with an overflow drain tube of a cleaning system.

FIG. 4 illustrates a shielding apparatus 50 of the invention removably positioned in contact with an overflow drain tube 34 of the cleaning system of FIGS. 1 and 2. Shielding apparatus 50 includes a shielding member 52 that is configured to be positioned over opening 38. Shielding member 52 is but one example of shielding means for substantially preventing airborne liquid 40 from entering into opening 38. Shielding member 52 preferably has a convex top surface 54. Alternatively, top surface 54 may have any other shape or configuration that is suitable for intercepting and diverting substantially all of airborne liquid 40 that would otherwise pass through opening 38. For example, top surface may instead be substantially planar and angularly displaced from the horizontal plane. Such a planar surface also shields opening 38 and directs airborne liquid 40 away from opening 38.

Shielding apparatus 50 also includes aligning means for maintaining alignment between shielding member 52 and opening 38. A preferred example of such aligning means is stem 56 that extends from shielding member 52 and is inserted into bore 58 of overflow drain tube 34. Stem 56 aligns shielding member 52 with opening 38 by constraining the distance that shielding member 52 may laterally move. If shielding apparatus 50 is moved sideways over overflow drain tube 34, stem 56 ensures that opening 38 remains covered by shielding member 52. Shielding apparatus 50 may include more than one stem 56. Alternatively, the invention may be practiced with other structures for aligning shielding member 52 with opening 38.

In a preferred embodiment, shielding apparatus 50 consists of a material or materials that have a relative density that is less than the relative density of the liquid in cleaning system 10. Accordingly, in the case that second volume 22 rises to a predetermined elevation at which it drains through overflow drain tube 34, shielding apparatus 50 will float in the liquid and be vertically displaced through some distance. This vertical displacement reduces the obstruction of opening 38 and facilitates draining of excess liquid through overflow drain tube 34. Stem 56 preferably has a sufficient length and extends into bore 58 a sufficient distance such that stem 56 remains in bore 58 in the event that shielding apparatus 50 is caused to float in the liquid.

Figure 5:
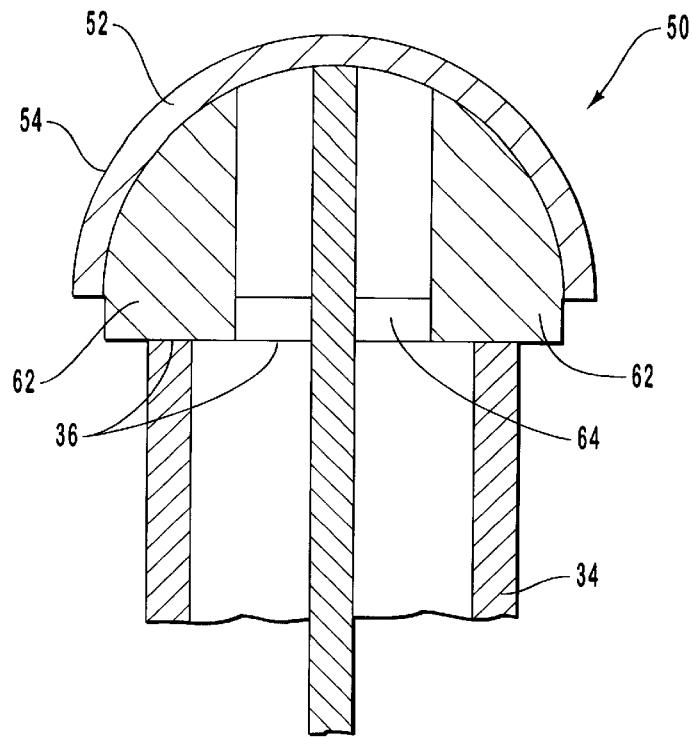
FIG. 5 is a partial cross section elevation view of the shielding apparatus of FIG. 4 installed in a overflow drain tube.

FIG. 5 is an enlarged cross-sectional view of shielding apparatus 50 and overflow drain tube 34 of FIG. 4. Shielding apparatus 50 preferably includes spacing means for providing a space between shielding member 52 and at least a portion of rim 36. A preferred example of such spacing means is at least one spacer 62 that is configured to be in contact with overflow drain tube 34. In particular, spacers 62 preferably rest upon rim 36 such that at least a portion of shielding member 50 is separated from rim 36. Accordingly, spacers 62 constitute one example of a portion of shielding apparatus 50 that may be in contact with overflow drain tube 34. Spacers 62 provide a space 64 between at least a portion of shielding member 50 and overflow drain tube 34 when stem 56 is fully inserted into bore 58. Space 64 allows overflow drain tube 34 to receive excess liquid while shielding apparatus 50 is disposed upon rim 36. Spacers 62 are not limited to the structure shown in FIG. 5, but may instead be another structure for providing space 64.

Figure 6:
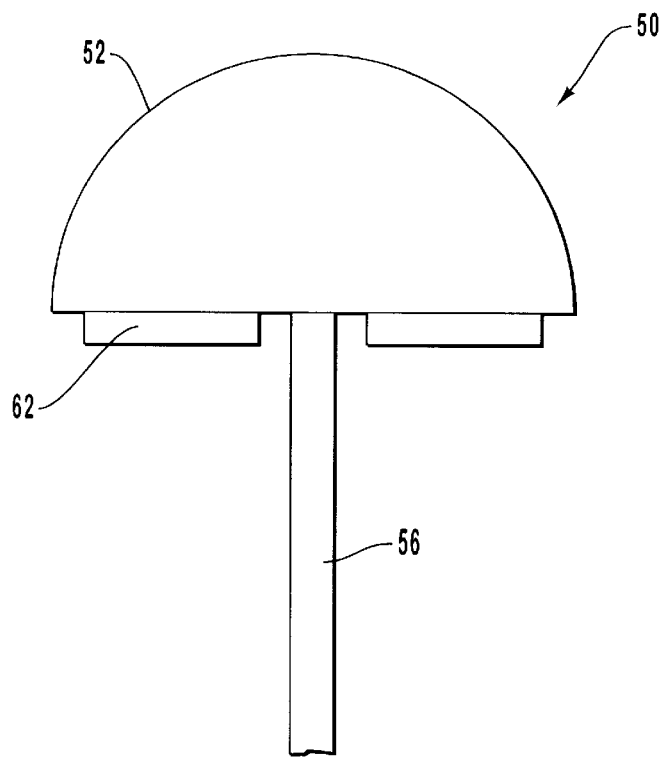
FIG. 6 is a partial elevation view of the shielding apparatus of FIG. 4.

Turning now to FIG. 6, shielding apparatus 50 is preferably constructed of a material that is substantially inert to the liquid of the system in which it is used. At least the entire surface of shielding apparatus 50 should consist of such an inert material. As used herein, "entire surface" includes at least all surfaces of shielding member 52, stem 56, and spacers 62 that are exposed and that may come into contact with the liquid during use of shielding apparatus 50 or the system in which it is used. When common acidic solutions are used in the cleaning system, shielding apparatus 50 may be constructed, for example, of tetrafluoroethylene.

Figure 7:
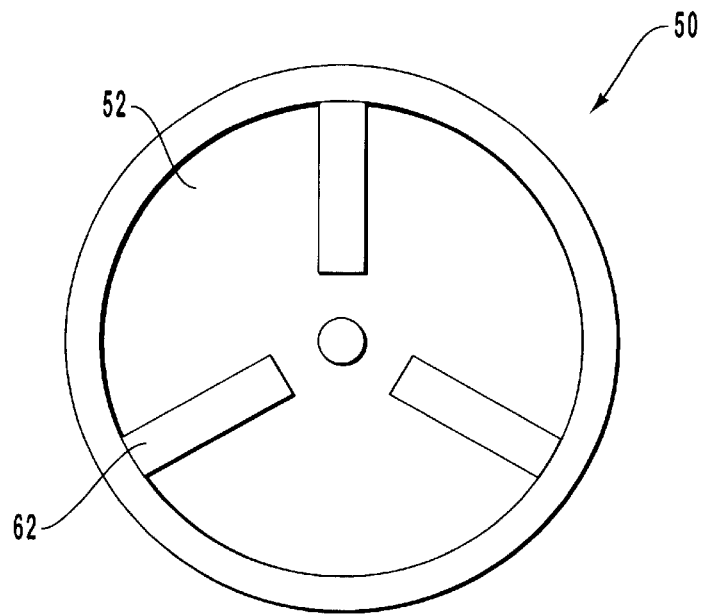
FIG. 7 is a bottom view of the shielding apparatus of FIG. 4.

FIG. 7 illustrates shielding apparatus 50 as viewed from below. By way of example and not by limitation, it has been found that shielding member 52 may be radially symmetric about an axis that is parallel to stem 56. It is also convenient for shielding member 52 to further have a circular profile when viewed from below, as in FIG. 7. A radially symmetric and circular profile advantageously allows shielding member 52 to correspond to the conventionally circular shape of overflow drain tube 34. It has also been found that a convenient arrangement of spacers 62 is that seen in FIG. 7, wherein three spacers 62 are circumferentially and equally spaced around shielding member 52. Accordingly, shielding apparatus 50 may securely rest upon rim 36 of overflow drain tube 34.

Figure 8:
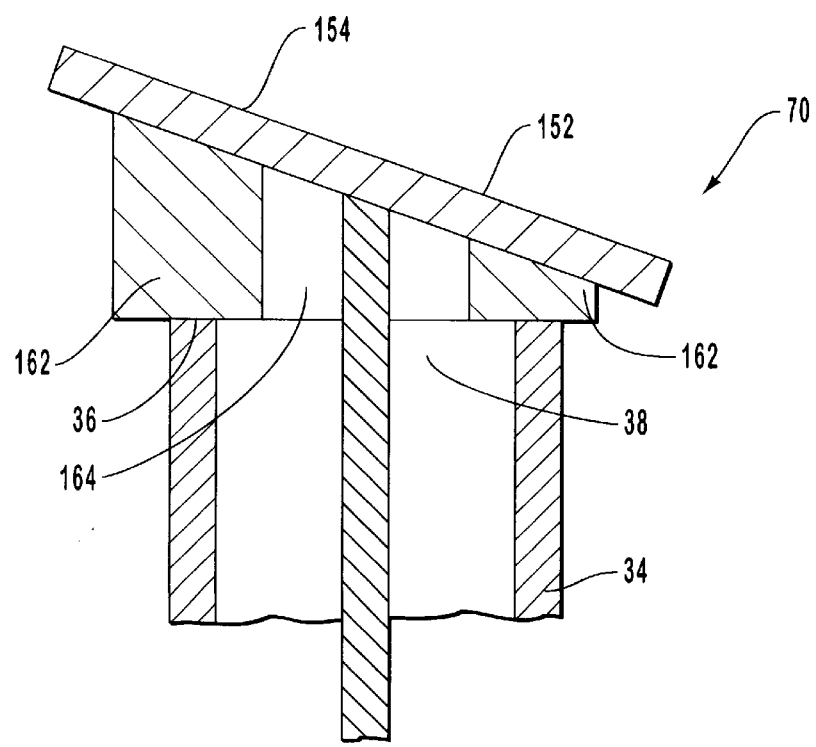
FIG. 8 is a partial cross section elevation view of the system of FIG. 1 taken along section line 2—2, and adding thereto an depiction of another embodiment of a shielding apparatus according to the invention, in which the shielding apparatus has a substantially planar shielding member.

FIG. 8 depicts an alternative embodiment of a shielding apparatus 70 according to the invention. Shielding apparatus 70 has a shielding member 152 with a substantially planar top surface 154 that is angularly displaced from the horizontal plane. Shielding member 152 may be positioned over opening 38 of overflow drain tube 34 in order prevent airborne liquid from entering opening 38. Spacers 162 are adapted to rest upon rim 36 to provide a space 164 between rim 36 and a portion of shielding member 152. In other respects, the features, elements, and use of shielding member 70 are substantially the same as those of shielding member 50 of FIGS. 4–7 as disclosed herein.

The shielding apparatus of the present invention may be adapted and used to shield openings of tubes other than the overflow drain tube disclosed herein. Moreover, the invention is not limited to a cleaning system or to the particular cleaning system specified herein. Instead, the shielding apparatus may be advantageously used in combination with substantially any opening to prevent airborne liquid from passing therethrough.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for cleaning a semiconductor structure, said method comprising:
   providing a cleaning system for circulating a liquid, said cleaning system having an overflow drain tube for draining a portion of said liquid upon said liquid reaching a predetermined elevation within said cleaning system, said overflow drain tube having an opening;
   providing a semiconductor structure within said liquid;
   providing a shielding apparatus in contact with said overflow drain tube by inserting at least one stem of said shielding apparatus into a bore of said overflow drain tube;
   cleaning said semiconductor substrate with said liquid; and
   inducing turbulence in said liquid so as to cause a portion of said liquid to become airborne, said shielding apparatus substantially preventing said airborne portion of said liquid from entering said opening.

2. A method as defined in claim 1, wherein said shielding apparatus comprises a shielding member positioned over said opening, said shielding member having a top surface for substantially preventing said airborne portion of said liquid from entering said opening.

3. A method as defined in claim 2, wherein said top surface is convex.

4. A method as defined in claim 2, wherein said top surface is substantially planar and is not parallel to a top surface of the volume of the liquid within the cleaning system.

5. A method as defined in claim 1, wherein inducing turbulence in said liquid causes said liquid to move relative to said semiconductor structure.

6. A method as defined in claim 5, wherein inducing turbulence in said liquid so as to cause said liquid to become airborne comprises pumping an acidic solution through said cleaning system.

7. A method for cleaning a semiconductor structure, said method comprising:

providing a first reservoir containing a first volume of a liquid;

providing a second reservoir containing a second volume of said liquid, said first reservoir and said second reservoir being in fluid communication such that at least some of said liquid flows from said first reservoir to said second reservoir;

providing an overflow drain tube having an opening and a rim surrounding said opening such that some of said liquid of said second volume flows over said rim and into said opening when said second volume of said liquid reaches a predetermined elevation;

providing a shielding apparatus in contact with said overflow drain tube by inserting at least one stem of said shielding apparatus into a bore of said overflow drain tube;

providing a semiconductor structure within said first volume of said liquid;

cleaning said semiconductor substrate with said first volume of said liquid; and inducing turbulence in said liquid so as to cause a portion of said liquid to become airborne, said shielding apparatus substantially preventing said airborne portion of said liquid from entering said opening.

8. A method as defined in claim 7, wherein said shielding apparatus has a convex surface that makes contact with said airborne portion of said liquid to prevent the same from entering said opening.

9. A method as defined in claim 7, wherein inducing turbulence in is caused when said at least some of said liquid flows from said first reservoir to said second reservoir.

10. A method for cleaning a semiconductor structure, said method comprising:

providing a cleaning system for circulating a liquid, said cleaning system having an overflow drain tube for draining a portion of said liquid upon said liquid reaching a predetermined elevation within said cleaning system, said overflow drain tube having an opening;

providing a semiconductor structure within said liquid;

providing a shielding apparatus in contact with said overflow drain tube so as to maintain a space between at least a portion of said shielding apparatus and a rim that surrounds said opening of said overflow drain tube;

cleaning said semiconductor substrate with said liquid; and inducing turbulence in said liquid so as to cause a portion of said liquid to become airborne, said shielding apparatus substantially preventing said airborne portion of said liquid from entering said opening.

11. A method as defined in claim 10, wherein said shielding apparatus comprises a shielding member positioned over said opening, said shielding member having a top surface for substantially preventing said airborne portion of said liquid from entering said opening.

12. A method as defined in claim 11, wherein said top surface is convex.

13. A method as defined in claim 11, wherein said top surface is substantially planar and is not parallel to a top surface of the volume of the liquid within the cleaning system.

14. A method as defined in claim 10, wherein inducing turbulence in said liquid causes said liquid to move relative to said semiconductor structure.

15. A method as defined in claim 14, wherein inducing turbulence in said liquid comprises pumping an acidic solution through said cleaning system.

16. A method for cleaning a semiconductor structure, said method comprising:

providing a first reservoir containing a first volume of a liquid;

providing a second reservoir containing a second volume of said liquid, said first reservoir and said second reservoir being in fluid communication such that at least some of said liquid flows from said first reservoir to said second reservoir;

providing an overflow drain tube having an opening and a rim surrounding said opening such that some of said liquid of said second volume flows over said rim and into said opening when said second volume of said liquid reaches a predetermined elevation;

providing a shielding apparatus in contact with said overflow drain tube so as to maintain a space between at least a portion of said shielding apparatus and a rim that surrounds said opening of said overflow drain tube;

providing a semiconductor structure within said first volume of said liquid;

cleaning said semiconductor substrate with said first volume of said liquid; and inducing turbulence in said liquid so as to cause a portion of said liquid to become airborne, said shielding apparatus substantially preventing said airborne portion of said liquid from entering said opening.

17. A method as defined in claim 16, wherein said shielding apparatus has a convex surface that makes contact with said airborne portion of said liquid to prevent the same from entering said opening.

18. A method as defined in claim 16, wherein inducing turbulence in said liquid is caused when said at least some of said liquid flows from said first reservoir to said second reservoir.

* * * * *